United States Patent [19]

Tyler et al.

[11] 4,379,287

[45] Apr. 5, 1983

[54] CAPACITIVE SWITCH AND PANEL

[75] Inventors: Hugh J. Tyler, Santa Ana, Calif.; William H. Conway, Midlothian, Va.

[73] Assignee: Robertshaw Controls Company, Richmond, Va.

[21] Appl. No.: 114,596

[22] Filed: Jan. 23, 1980

Related U.S. Application Data

[63] Continuation of Ser. No. 932,086, Aug. 8, 1978, abandoned.

[51] Int. Cl.³ .................. G06F 3/02; H01G 1/005; H01G 1/01; H01G 1/013
[52] U.S. Cl. .................. 340/365 C; 200/52 R; 200/DIG. 1; 361/303; 361/330
[58] Field of Search ............ 340/365 C; 200/DIG. 1, 200/DIG. 2, 5 A, 52 R, 159 B, 275; 307/98, 99, 116; 361/289, 281, 339, 303, 288

[56] References Cited

U.S. PATENT DOCUMENTS

| | | | |
|---|---|---|---|
| 2,634,315 | 4/1953 | Allison et al. | 361/330 |
| 3,492,440 | 1/1970 | Cerbone et al. | 340/365 C |
| 3,728,501 | 4/1973 | Larson et al. | 200/DIG. 2 |
| 3,819,906 | 6/1974 | Gould | 219/506 |
| 3,821,617 | 6/1974 | Shelby et al. | 361/303 |
| 3,917,013 | 7/1976 | Challoner et al. | 340/365 C |
| 3,921,167 | 11/1975 | Fox | 340/365 C |
| 3,951,250 | 4/1976 | Pointon et al. | 340/365 C |
| 3,974,472 | 8/1976 | Gould | 200/DIG. 1 |
| 4,035,795 | 7/1977 | Fosnough et al. | 340/365 C |
| 4,056,699 | 11/1977 | Jordan | 200/5 A |
| 4,123,631 | 10/1978 | Lewis | 340/365 C |

OTHER PUBLICATIONS

American Microsystems Inc., "Touch Control Circuits for Capacitance Switching".

Primary Examiner—James J. Groody
Attorney, Agent, or Firm—Harold W. Adams

[57] ABSTRACT

A user, touch actuable switch panel of the capacitive type that includes one or more touch actuable capacitive switches, each switch including at least two capacitive plate elements formed on a dielectric panel. Conductive paths formed on the dielectric panel interconnect the capacitive plate elements to a source for applying signals to the capacitive plate elements forming said capacitive switches and sensing a resulting change in signal level when a selected switch is actuated by the user. Trim tabs formed on the dielectric panel are provided to balance the effect of stray capacitance between the conductive paths and the capacitive plate elements to maintain the level of change of signal at a determined value upon the actuation of each of said one or more capacitive switches.

8 Claims, 7 Drawing Figures

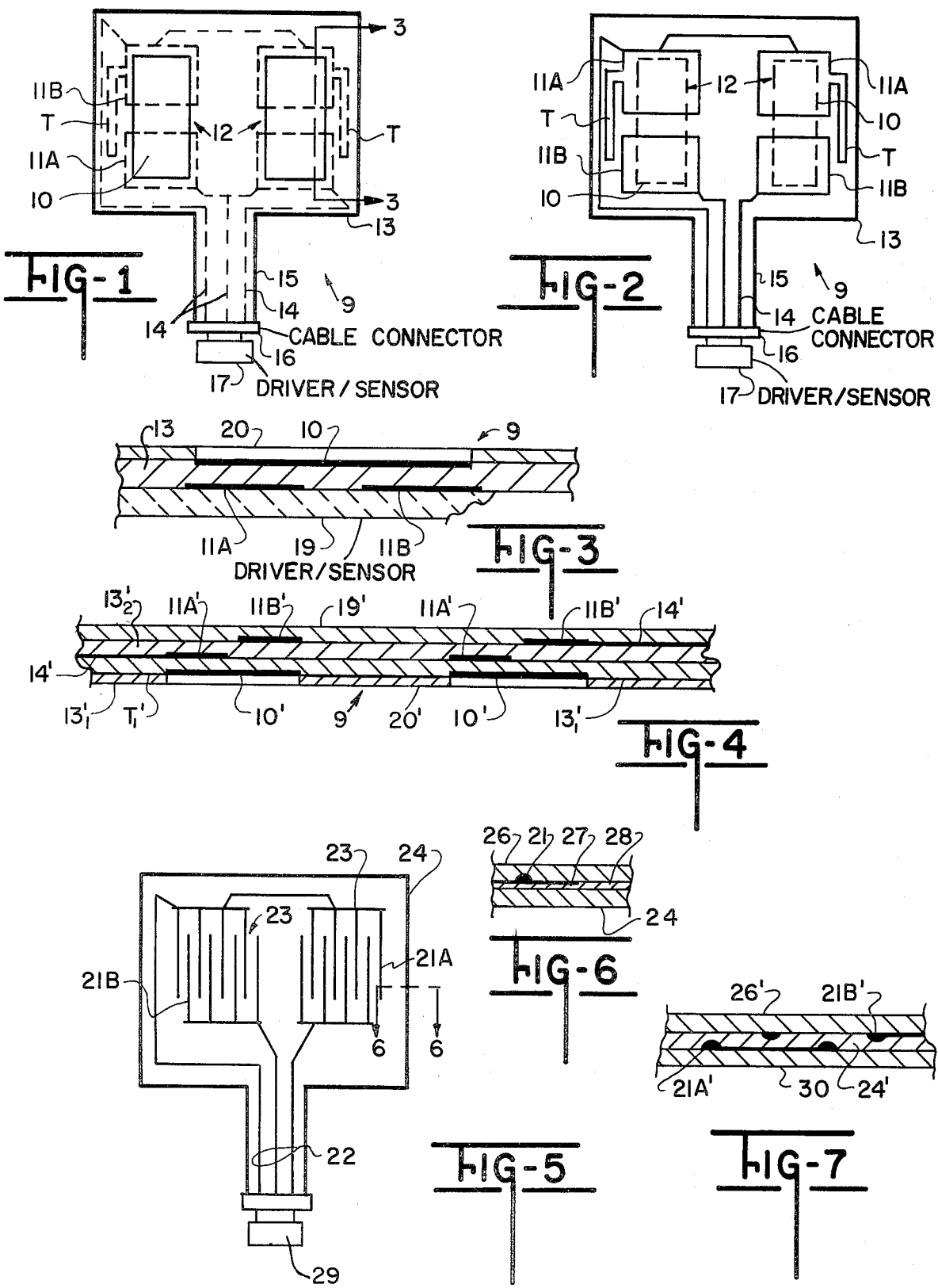

CAPACITIVE SWITCH AND PANEL

This is a continuation application of co-pending U.S. patent application, Ser. No. 932,086, filed Aug. 8, 1978 and now abandoned which was co-pending with U.S. patent application Ser. No. 905,061, filed May 11, 1978, now abandoned, entitled Control Panel and System and of which the inventors' herein are co-inventors.

BACKGROUND OF THE INVENTION

In the aforementioned co-pending U.S. patent application filed May 11, 1978, Ser. No. 905,061, entitled CONTROL PANEL AND SYSTEM and of which the inventors herein are also co-inventors, a capacitive touch entry switch and panel is disclosed in which certain of the capacitive plates and interconnecting electrical circuits are formed on a flexible sheet of non-conductive material attached to a dielectric panel that forms a part of each capacitive switch.

PRIOR ART STATEMENT

In addition to the aforesaid co-pending patent application, the disclosure as well as the following prior art referred to therein are incorporated herein by reference: U.S. Pat. Nos. 3,819,906; 3,886,539; 3,974,472; 4,056,699 and a paper entitled Application Note, printed by American Microsystems, Inc. of 3800 Homestead Road, Santa Clara, Calif. Copies of the above are filed with the application.

In addition to the above noted prior art, U.S. Pat. No. 3,728,501 which issued Apr. 17, 1973 discloses a fringe type capacitive switch including interdigital capacitive plate elements. U.S. Pat. No. 4,035,795 which issued July 12, 1975, discloses a capacitive switch touch keyboard in which the switch elements are disposed on a glass panel while U.S. Pat. No. 3,971,013 which issued July 20, 1976, discloses a touch keyboard arrangement in which touch keys are disposed on a sheet of flexible dielectric. Copies of the aforementioned patents are attached and included herein.

SUMMARY OF THE INVENTION

An object of this invention is to provide a flexible capacitive switch and panel and methods of making and using same in which all of the capacitive plates of one or more capacitive switches comprising a keyboard panel and a cable for connecting the panel to a separate electronic circuit means responsive to the actuation of the switches are all disposed on a flexible, dielectric tape. The switches may be either conductively or capacitively coupled to ground when touched and actuated. The tape may be formed of one or more sheets or films of mylar or the like.

The resulting unitary, flexible capacitive touch panel may be used by supporting the same upon any suitable means that avoids electrical contact with the capacitive plates and interconnecting circuitry.

BRIEF DESCRIPTION OF THE DRAWINGS

The objects and advantages of the invention will be understood from the following description when read in view of the appended drawings wherein:

FIG. 1 is a front plan view of a preferred embodiment of a flexible capacitive switch and panel in accordance with the principles of the invention;

FIG. 2 is a rear plan view of the invention illustrated in FIG. 1;

FIG. 3 is a partial cross-sectional view taken along the lines 3—3 in FIG. 1 illustrating the invention affixed to a non-conductive backing surface;

FIG. 4 is a partial cross-sectional view illustrating an alternative embodiment of the invention shown in FIGS. 1–3 in which the capacitive plates forming the respective capacitive switches are disposed on two sheets of tape to form the flexible panel;

FIG. 5 is a rear view of still another alternative embodiment of the invention in which the flexible panel is formed of a single tape and all capacitive switch plates and interconnecting electrical circuitry are formed on the same side of the tape;

FIG. 6 is a partial, cross-sectional view taken along lines 6—6 in FIG. 5 illustrating the method of applying markings, background coloring and the capacitive switch elements and conductive plates on the same side of a flexible tape; and FIG. 7 is a partial, enlarged cross-sectional view of an alternative embodiment of the invention shown in FIG. 6 wherein the interleaved capacitive plates are formed on opposite sides of a flexible panel of dielectric material.

BRIEF DESCRIPTION OF THE INVENTION

Referring to the drawing, FIGS. 1–3 illustrate a preferred embodiment of a flexible, touch operated capacitive switch panel 9 in accordance with the invention. External, electrically conductive capacitive touch plates 10 and two pair of internal, electrically conductive drive and sense plates 11A and 11B form two capacitive switches generally designated by the reference numeral 12. All plates 10 and 11A and 11B comprising the switches 12 are formed on a single, flexible sheet 13 of dielectric material such as mylar tape or the like.

Conductive paths 14 connecting the electrically conductive capacitive plates 10 and 11A and 11B are brought out on a narrowed tail integrally formed on the tape that serves as a flexible connector cable 15. A commercially available, flat cable connector 16 permits the panel 9 to be connected to suitable electronic circuit means 17 arranged to apply drive signals and sense and utilize the actuation of the respective capacitive switches 12 as is well known and described in detail in the references cited in the Prior Art Statement.

The electrically conductive capacitive plates 11A and 11B and interconnecting circuits 14 may be formed on the flexible tape 13 by silk screening, etching, or other means as well known, a pair of the internal plates 11A and 11B forming each switch 12 being oppositely disposed from an external touch plate 10.

Electrically, the panel 9 is arranged so that each plate 11A and 11B forms a capacitor with the plate 10 disposed on the opposite side of the tape 13, the two capacitors thus formed being in series electrically. Thus, a signal applied to a drive plate 11A is loaded to ground when the external plate 10 is physically touched and thus conductively coupled to ground by a user. This lowers the level of the output signal at sense plate 11B. It is this change in level of the output signal that is sensed by the electronic circuit means, 17 signifying a switch operation.

As shown in FIG. 2, each switch 12 may be provided with capacitive trim tabs T for the purposes described in the inventors co-pending patent application. As there disclosed, the effects of stray capacitance $C_s$ caused by coupling between interconnecting circuits and producing variations in the change of output signal levels for different switch actuations, is eliminated.

By properly trimming the individual tabs T, all switches 12 on the entire keyboard 9 can be balanced to compensate for any differences in stray capacitance $C_s$ from switch to switch. The change in output signal level upon the actuation of each switch 12 thus becomes substantially constant regardless of differences in stray capacitiance $C_s$ at the respective switches as explained in greater detail in the aforementioned co-pending patent application.

Typically, and is as well known, the operation of each capacitive switch 12 is as follows: drive pads 11A are driven with a signal from the electronics circuit 17 which may be a microprocessor or other suitable signal source.

The applied signal enters each touch pad 10 from a drive paid 11A and exits through an associated sense pad 11B. This continues until a pad 10 is touched by an operator grounding same. This greatly reduces the level of the signal from sense pad 11B which is detected by the electronic circuit means 17 signifying a switch operation.

If desired, the electrically conductive capacitive plates 10, 11A and 11B and conductive paths 14 may be deposited on a clear tape 13 by the sputtering or vapor deposition of transparent films of gold or other suitable electrically conductive material. Thus, the entire touch switching panel 9 can be made transparent except for any desired indicia, legends, and designs which may be applied using any suitable non-conductive paint. The unitary capacitive touch panel 9 thus formed may be used by affixing it to any suitable backing member 19, formed of non-conductive material by means of a non-conductive adhesive.

FIG. 4 illustrates an alternative embodiment of the invention shown in FIGS. 1–3 wherein a flexible panel 9' is formed of two sheets of a dielectric material such as mylar tape $13_1'$ and $13_2'$ or the like, affixed together by means of a non-conductive adhesive. The internal capacitive segments or plates 11A' and 11B' as well as the electrically conductive paths 14' connected thereto are disposed on opposite sides of tape $13_2'$. Touch plates 10' are formed on tape $14_1'$. Thus, the capacitive plates 11A' and 11B' of each switch 12' are separated by the thickness of tape $13_2'$; and from plates 10' by the thickness of tape $13_1'$.

With this arrangement, compared to that in FIGS. 1–3 connecting circuits 14' on the tape $T_2'$, when a plurality of switches 12' are disposed on a single panel 9', can be shortened as cross overs are eliminated. In this instance, connecting circuits 14' are brought out on opposite sides of a strap 15' that forms a flexible cable permitting a plug connection to an electronic circuit 17' not shown.

The flexible panel 9' may also be similarly affixed to a non-conductive backing member 19'. A protective, transparent and non-conductive coating of glass or of flexible dielectric material 20 or 20' may also be applied to the front face of the flexible panels 9 or 9' respectively around the touch plates 10 and 10' to protect the panel from wear.

Referring now to FIGS. 5 and 6, yet another alternative embodiment of the invention is disclosed in which all of the capacitive plates 21A and 21B and interconnecting circuits 22, for a pair of fringe effect capacitive switches 23 are disposed on the same side of a panel 24 formed of a flexible dielectric material such as mylar or the like.

Thus, as in the case of the invention previously described, an entire capacitive switch touch panel 24 with connecting electrical circuits can be formed on a single flexible sheet of dielectric material. The flexible touch panel 24 may be affixed to a backing member 26 of non-conductive material such as paperboard or the like or supported in a suitable frame. When fabricating the touch panel from a transparent dielectric sheet 24 identifying indicia 27 for each switch 23 such as numbers, letters or other symbols are first applied to the back side of the flexible panel 24 using any suitable con-conductive paint or the like.

If a background color is required, this too is applied to the back side of the panel 24 using a non-conductive coat of paint around the identifying indicia (as shown in FIG. 6) or over the entire back surface.

Thereafter the electrically conductive, interdigital capacitive plate elements 21A and 21B and interconnecting conductors 22 are printed, silk screened, or etched on the painted surface of the panel 24. The completed flexible panel 24 may be used by affixing it to the non-conductive backing panel 26 using a non-conductive adhesive. The printed switches 23 are thus protected from exposure to the operator or elements by the thickness of the panel 24 to the front and from the rear by the backing member 26 if employed. Only a smooth, durable touch surface is exposed to the operator.

When the smooth surface of the panel 24 opposite the interdigital capacitive plates 21A and 21B is touched, the switch is capacitively coupled to ground, the operators finger serving as a grounded capacitive plate. This sharply decreases the switch capacitance causing a change in signal level which is detected by suitable electronic circuit means 29 indicating a capacitive switch operation as is well known.

While the capacitive plates 21A and 21B have been shown as straight relatively narrow interdigital members, the number and surface area of each pattern may be varied to configuration giving the desired switch capacitance and change in signal level when actuated. And, the panel 24 may be fabricated to provide a plurality of switches 23 on a single flexible dielectric sheet in any desired switch matrix.

The interdigital members of capacitive plates 21A and 21B may also be printed or otherwise formed on opposite sides of a flexible, dielectric tape 24' as shown in FIG. 7, an enlarged, parital cross-sectional view of such an alternative embodiment. The completed touch panel 24' can also be used by affixing it to any non-conductive backing member 26' by means of a non-conductive adhesive or the like. The exposed capacitive members plate 21A' are then covered with a second transparent flexible tape 30 bearing any desired indicia on the inside surface. The tape 30 is also secured to the tape 24' by means of a non-conductive adhesive.

While a preferred and a number of alternative embodiments of the invention have been described in detail, numerous changes and modifications can be made within the principles of the invention which is to be limited only by the scope of the appended claims.

What is claimed is:

1. In a user, touch actuable switch panel of the capacitive type including one or more touch actuable capacitive switches each switch including at least two capacitive plate means formed on a dielectric panel and conductive paths formed on said dielectric panel for interconnecting the capacitive plate means to means for applying signals to said capacitive plate means forming a respective capacitive switch and sensing a resulting change in signal level when said respective switch is actuated by said user, the improvement comprising:

means formed on said dielectric panel for balancing the effect of stray capacitance between said conductive paths and said capacitive plate means forming said one or more capacitive switches and maintaining the level of said change of signal at a determined value upon the actuation of one of said respective capacitive switches.

2. The invention as defined in claim 1 wherein the capacitive plate means forming said one or more switches and the conductive paths connected thereto are oppositely disposed on opposed sides of said, dielectric panel.

3. The invention as defined in claim 1 wherein said capacitive plate means forming each of said one or more switches are disposed on the same side of said, dielectric panel.

4. The invention as defined in claim 1 wherein said capacitive plate means forming said switch comprises:

an electrically conductive touch plate on one side of said flexible, dielectric tape;

and electrically conductive drive and sense plates disposed on the opposing side of said, dielectric panel opposite said touch plate, said conductive paths interconnecting said sense and drive plates to said electrical circuit means whereby said capacitive switch is conductively coupled to ground when actuated.

5. The invention as defined in claim 4 wherein said dielectric panel is formed of at least two flexible films of dielectric material affixed together, one of said sense or drive pads being disposed on the outer side of a first of said flexible, dielectric films and the other of said sense or drive plates being disposed between and upon the inside of either of said two films of dielectric material, said touch plate being disposed on the outside of said second film of flexible dielectric material.

6. The invention as defined in claim 5 including a coating of non-conductive material around said touch plate on said outside of said second flexible film.

7. The invention as defined in claim 2 wherein said dielectric panel is a flexible, dielectric tape.

8. The invention as defined in claim 3 wherein said dielectric panel is a flexible, dielectric tape.

* * * * *